United States Patent
Adams

(10) Patent No.: US 6,809,537 B2
(45) Date of Patent: Oct. 26, 2004

(54) INTERCONNECT DEVICE FOR ELECTRICALLY COUPLING A TEST SYSTEM TO A CIRCUIT BOARD ADAPTED FOR USE WITH A BALL-GRID ARRAY CONNECTOR

(75) Inventor: Christopher Scott Adams, San Jose, CA (US)

(73) Assignee: FCI Americas Technology, Inc., Reno, NV (US)

( * ) Notice: Subject to any disclaimer, the term of this patent is extended or adjusted under 35 U.S.C. 154(b) by 0 days.

(21) Appl. No.: 10/639,319

(22) Filed: Aug. 12, 2003

(65) Prior Publication Data

US 2004/0048499 A1 Mar. 11, 2004

Related U.S. Application Data

(62) Division of application No. 09/996,150, filed on Nov. 28, 2001, now Pat. No. 6,655,965.

(51) Int. Cl.[7] ............................................. G01V 3/02
(52) U.S. Cl. ...................... 324/755; 439/74; 439/528; 439/66
(58) Field of Search ............................. 439/74, 66, 68, 439/69, 71, 70, 525, 528; 324/755, 754

(56) References Cited

U.S. PATENT DOCUMENTS

| | | | |
|---|---|---|---|
| 5,397,254 A | 3/1995 | Powell | 438/844 |
| 5,511,306 A | 4/1996 | Denton et al. | 29/840 |
| 5,532,612 A * | 7/1996 | Liang | 324/760 |
| 5,537,051 A * | 7/1996 | Jalloul et al. | 324/758 |
| 5,548,223 A * | 8/1996 | Cole et al. | 324/754 |
| 5,645,433 A * | 7/1997 | Johnson | 439/66 |
| 5,859,538 A | 1/1999 | Self | 324/755 |
| 5,861,322 A | 1/1999 | Caillat et al. | 438/107 |
| 5,896,037 A | 4/1999 | Kudla et al. | 324/755 |
| 6,002,169 A | 12/1999 | Chia et al. | 257/697 |
| 6,007,348 A | 12/1999 | Murphy | 439/70 |
| 6,024,584 A | 2/2000 | Lemke et al. | 439/83 |
| 6,069,481 A | 5/2000 | Matsumura | 324/755 |
| 6,270,356 B1 | 8/2001 | Hoshino et al. | 439/70 |
| 6,278,284 B1 | 8/2001 | Mori et al. | 324/755 |
| 6,300,781 B1 | 10/2001 | Yap et al. | 324/755 |
| 6,394,820 B1 | 5/2002 | Palaniappa et al. | 439/70 |

* cited by examiner

*Primary Examiner*—Gary Pauman
*Assistant Examiner*—Edwin A. Leon
(74) *Attorney, Agent, or Firm*—Woodcock Washburn LLP

(57) ABSTRACT

A presently-preferred interconnect device for electrically coupling a test instrument and a circuit board having a first portion of a ball grid array connector mounted thereon comprises a pin header and a second portion of the ball grid array. The second portion is mounted on the pin support member and comprises a plurality of electrically conductive contact members each being electrically coupled to a respective terminal pin of the pin header. The interconnect device further comprises a circuit substrate having a plurality of electrical connection points formed on a surface thereof and being adapted to be electrically coupled to the test instrument, and a socket receptacle mounted on the circuit substrate. The socket receptacle comprises a plurality of pin receptacles adapted to removably receive a respective one of the terminal pins and being electrically coupled to a respective electrical connection point.

2 Claims, 6 Drawing Sheets

INTERCONNECT DEVICE FOR ELECTRICALLY COUPLING A TEST SYSTEM TO A CIRCUIT BOARD ADAPTED FOR USE WITH A BALL-GRID ARRAY CONNECTOR

This application is a divisional of Ser. No. 09/996,150 filed Nov. 28, 2001 now U.S. Pat. No. 6,655,965, the entirety of which is incorporated herein by reference.

FIELD OF THE INVENTION

The present invention relates to electrical connectors, and more particularly to an interconnect device for electrically coupling a test instrument to a circuit board adapted for use with a ball grid array (BGA) connector.

BACKGROUND OF THE INVENTION

BGA connectors are used in many applications where a low-profile, high-density electrical connector is desired or required. For example, circuit-board manufacturers often mount one or more BGAs on their circuit boards prior to shipping the boards to an intermediate or end user.

A typical BGA connector comprises a receptacle portion, and a plug portion adapted to mate with the receptacle portion. The plug and receptacle portions each include an insulative housing having a plurality of through holes formed therein. A plurality of male contact members positioned within the through holes of the plug portion, and a plurality of female contact members positioned within the through holes of the receptacle portion.

Each conducting member has a ball-shaped piece of solder material fixed to an end thereof. The balls of solder material protrude from the housing, and form a grid array on a surface of the plug or receptacle portions. The plug and receptacle portions are each mounted on a respective circuit substrate by aligning the respective grid arrays with a corresponding array of electrical contact points on a surface of the substrate. The solder balls are then reflowed to form a solder joint between each conducting member and a corresponding electrical connection point. These solder joints make it difficult to remove the plug and receptacle portions from the circuit substrate once the plug and receptacle portions have been mounted thereon.

The number of mating cycles for the plug and receptacle portions of a typical BGA conenctor, i.e., the number of times the plug and receptacle portions can be mated and unmated, is usually limited. For example, some types of BGA connectors commonly used on circuit boards must be discarded or reworked after approximately thirty to fifty mating cycles.

BGA-equipped circuit boards are usually subjected to functional checks prior to shipment. These checks are typically performed by interconnecting the circuit board to a test system via the BGA connector. More particularly, the receptacle (or plug) portion mounted on the circuit board is mated with a complementary plug (or receptacle) portion mounted on a circuit substrate of the test system. The substrate is electrically coupled to a test instrument. The test instrument is adapted to evaluate the functionality of the circuit board by sending electrical signals to the circuit board, and receiving and analyzing responsive signals therefrom.

A plug or receptacle portion used in a test system may be subjected to frequent mating cycles as circuit boards undergoing pre-shipment or research-and-development testing are repeatedly coupled and decoupled to and from the test system via the plug or receptacle portion. Such use can cause the plug or receptacle portion to reach the end of its useful life after a relatively short time period.

The above-noted difficulty in removing the plug or receptacle portion from its mounting surface usually necessitates replacement of the circuit substrate of the test system when the plug or receptacle portion mounted thereon reaches the end of its useful life. Replacing the circuit substrate on a relatively frequent basis can substantially increase the expense and time associated with the testing process. A need therefore exists for a device for interconnecting a test instrument to a circuit board adapted for use with a BGA connector, wherein the device can be used repeatedly without a need to replace or rework a circuit substrate of the corresponding test system.

SUMMARY OF THE INVENTION

A presently-preferred interconnect device for electrically coupling a test instrument and a circuit board having a first portion of a ball grid array connector mounted thereon comprises a pin header. The pin header comprises an insulative pin support member having a plurality of through holes extending between a first and a second surface thereof, and a plurality of terminal pins each positioned within and extending from a respective one of the through holes. The interconnect device also comprises a second portion of the ball grid array connector adapted to mate with the first portion. The second portion is mounted on the first surface of the pin support member and comprises a plurality of electrically conductive contact members each being electrically coupled to a respective one of the terminal pins.

The interconnect device further comprises a circuit substrate having a plurality of electrical connection points formed on a surface thereof and being adapted to be electrically coupled to the test instrument, and a socket receptacle mounted on the circuit substrate. The socket receptacle comprises an insulative receptacle support member having a plurality of through holes formed therein, and a plurality of pin receptacles each extending through a respective one of the through holes in the receptacle support member. Each of the pin receptacles is adapted to removably receive a respective one of the terminal pins and is electrically coupled to a respective electrical connection point.

A presently-preferred system for electrically communicating with a circuit board having one of a plug portion and a receptacle portion of a ball grid array connector mounted thereon comprises a signal conditioning device adapted to send and receive electrical signals, and a substrate having a plurality of electrical connection points on a surface thereof. The electrical connection points are electrically coupled to the signal conditioning device. The system also comprises a pin header comprising an insulative pin support member and a plurality of terminal pins extending through and projecting from the pin support member.

The system further comprises a socket receptacle mounted on the circuit substrate and comprising an insulative receptacle support member and a plurality of pin receptacles extending through the receptacle support member. Each of the pin receptacles is adapted to removably receive a respective one of the terminal pins, and is electrically coupled to a respective one of the electrical connection points. The system also comprises the other of the plug portion and the receptacle portion of the ball grid array connector mounted on and electrically coupled to the pin support member.

A presently-preferred system for testing a circuit board having a first portion of a ball grid array connector mounted thereon comprises an interconnect device. The interconnect device comprises a pin header comprising an insulative pin support member and a plurality of terminal pins at least partially disposed within the support member. The interconnect device also comprises a second portion of the ball grid array connector adapted to mate with the first portion. The second portion is mounted on the pin support member and comprises a ball grid array and a plurality of contact members electrically coupled to the terminal pins via the ball grid array.

The interconnect device further comprises a circuit substrate having a plurality of electrical connection points formed on a surface thereof, and a socket receptacle mounted on the circuit substrate. The socket receptacle comprises an insulative receptacle support member and a plurality of pin receptacles at least partially disposed within the socket receptacle. Each of the pin receptacles is adapted to removably receive a respective one of the terminal pins and is electrically coupled to a respective electrical connection point. The system also comprises a test instrument electrically coupled to the circuit substrate and being adapted to generate and send electrical signals to the circuit board and to analyze responsive signals from the circuit board thereby evaluating the functionality of the circuit board.

A presently-preferred ball grid array connector system adapted for sub-surface mounting on a circuit substrate comprises a plug portion. The plug portion comprises an insulative housing having a plurality of through holes formed therein and extending between a first and a second surface thereof, and a plurality of male contact members each mounted in a respective one of the through holes. The system also comprises a receptacle portion comprising an insulative housing having a plurality of through holes formed therein and extending between a first and a second surface thereof, and a plurality of female contact members each mounted in a respective one of the through holes in the receptacle portion and begin adapted to removable engage a respective male contact member.

The system further comrises a pin header comprising an insulative pin support member having a plurality of through holes extending between a first and a second surface thereof, and a plurality of terminal pins each positioned within and extending from a respective one of the through holes in the pin support member. One of the plug portion and the receptacle portion is mounted on the pin header and each of the contact members of the one of the plug portion and the receptacle portion is electrically coupled to a respective one of the terminal pins.

A presently-preferred method for evaluating the functionality of a plurality of circuit boards each having a first portion of a ball grid array connector mounted thereon comprises mating a pin header with a complementary socket receptacle, and mating the first portion of the ball grid array connector with a complementary second portion of the ball grid array connector mounted on the pin header. The method also comprises directing electrical signals between a test instrument and the circuit board by way of the socket receptacle, the pin header, and the first and second portions of the ball grid array. The method further comprises removing and replacing the pin header and the second portion of the ball grid array after the second portion of the ball grid array connector has undergone a predetermined number of mating cycles.

A presently-preferred method of manufacturing one of a pin header and a socket receptacle comprises forming a plurality of through holes in a support member, the plurality of through holes being arranged in a plurality of rows and a plurality of columns. The method also comprises inserting a first plurality of conductive members in alternating ones of the through holes in each of the plurality of rows and in each of the plurality of columns. The method further comprises subsequently inserting a second plurality of conductive members in ones of the through holes adjacent the alternating ones of the through holes in each of the plurality of rows and in each of the plurality of columns.

BRIEF DESCRIPTION OF THE DRAWINGS

For the purpose of illustrating the invention, the drawings show an embodiment that is presently preferred. The invention is not limited, however, to the specific instrumentalities disclosed in the drawings. In the drawings.

DESCRIPTION OF PREFERRED EMBODIMENTS

FIGS. 1–8B depict a presently-preferred interconnect device 10 for coupling a test instrument and a circuit board adapted for use with a BGA connector. A particular type of circuit board and BGA connector are described in detail herein for exemplary purposes only; the invention can be applied to circuit boards and BGA connectors of virtually any type. (The term "circuit board," as used throughout the specification and claims, is intended to encompass all types of boards commonly used in electronic devices, including printed circuit boards, printed wire boards, component boards, backplanes, etc.)

Figure 1:
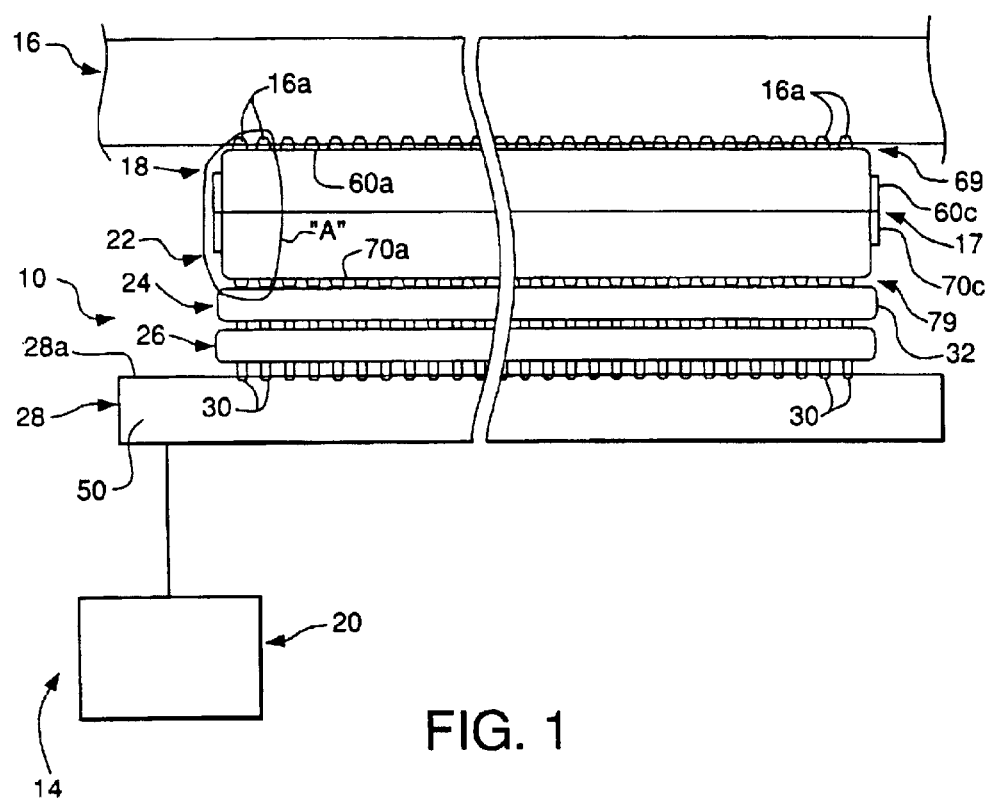
FIG. 1 is a diagrammatic side view of a presently-preferred test system, including an interconnect device, for a circuit board adapted for use with a BGA connector (also shown)
Figure 2:
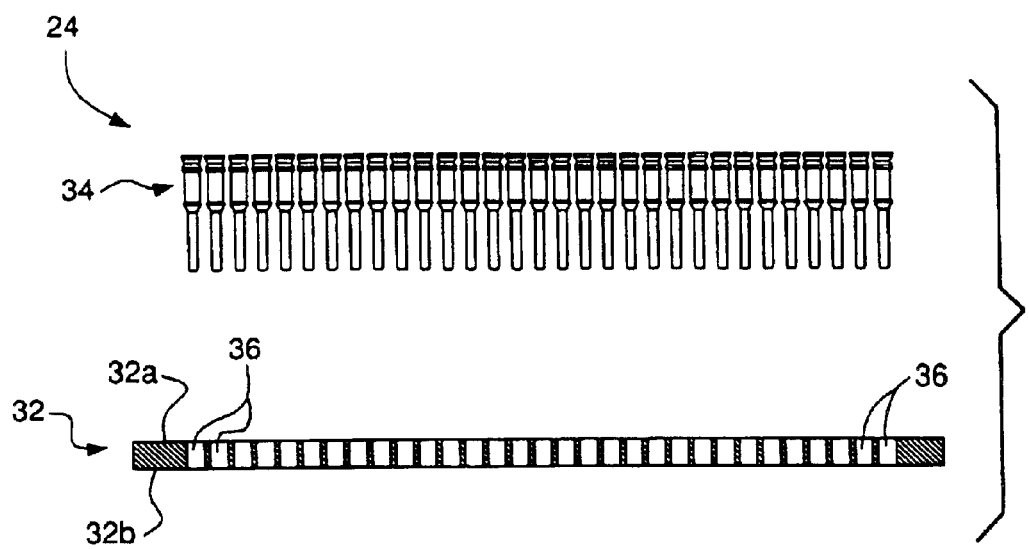
FIG. 2 is an exploded side view of a pin header of the interconnect device shown in FIG. 1.
Figure 3:
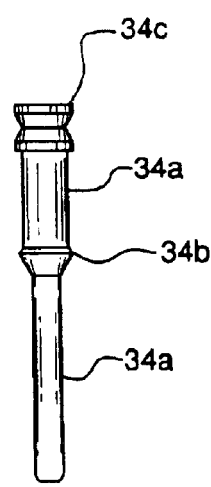
FIG. 3 is a side view of a terminal pin of the pin header shown in FIG. 2.
Figure 4:
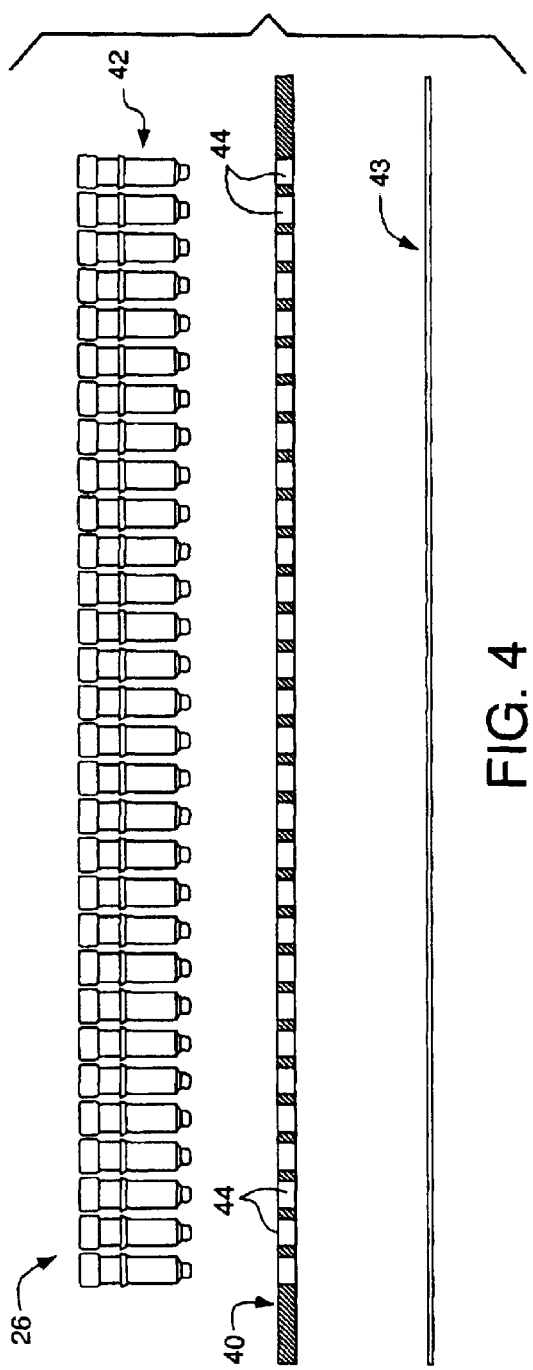
FIG. 4 is an exploded side view of a socket receptacle of the interconnect device shown in FIG. 1.
Figure 5:
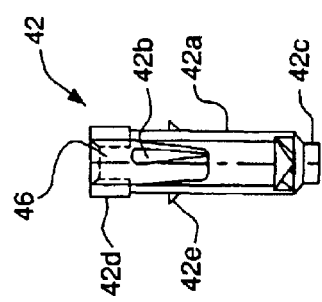
FIG. 5 is a side view of a pin receptacle of the socket receptacle shown in FIG. 4.

The interconnect device 10 forms part of a test system 14 (see FIG. 1). The test system 14 is adapted for use with an circuit board 16 having a receptacle portion 18 mounted thereon. The interconnect device includes a plug portion 22 for mating with the receptacle portion 18. The plug portion 22 and the receptacle portion 18 together form a BGA connector system 17.

The plug portion 22 and a receptacle portion 18 each comprise a total of three-hundred contact members arranged in a ten-row, thirty-column array. This particular detail is presented for exemplary purposes only; the invention can be used in conjunction with BGA connectors having virtually any number and arrangement of contact members. Further details relating to the connector system 17 are presented below.

The test system 14 also comprises a suitable test instrument 20 electrically coupled to the interconnect device 10. The test instrument 20 is adapted to generate and send electrical signals to the circuit board 16 via the interconnect device 10 and the receptacle portion 18. The test instrument 20 also receives and analyzes responsive signals from the circuit board 16, and thereby evaluates the functionality of the circuit board 16 and the receptacle portion 18. Further details concerning the test instrument 20 are not necessary to an understanding of the invention, and therefore are not included herein.

The interconnect device 10 comprises the plug portion 22, as noted above. The interconnect device 10 also comprises a pin header 24 mechanically and electrically coupled to the plug portion 22, and a socket receptacle 26 adapted to mate with the pin header 24. The interconnect device 10 further comprises a circuit substrate 28 having a plurality of electrical connection points 30 disposed on an upper surface 28a thereof. The socket receptacle 26 is mounted on the surface 28a, and is electrically coupled to the circuit substrate 28 via the electrical connection points 30. The circuit substrate 28 is electrically coupled to the test instrument 20.

Details relating to the pin header 24 are as follows. The pin header 24 comprises a pin support member 32, and a plurality of terminal pins 34 arranged in a pattern that substantially matches a ball grid array of the plug portion 22 (see FIGS. 2 and 3). (The ball grid array of the plug portion 22 is described in detail below). The pin header 24 thus comprises three-hundred of the terminal pins 34 arranged in a thirty rows and ten columns.

The pin support member 32 is formed from an electrically-insulative material such as FR4. The pin support member 32 has an upper surface 32a and a lower surface 32b. A plurality of through holes 36 are formed in the pin support member 32, and extend between the upper and lower surfaces 32a, 32b. (Directional terms such as "upper," "lower," etc. are used throughout the specification and claims with reference to the component orientations depicted in FIG. 1. These terms are used for illustrative purposes only, and are not intended to limit the scope of the appended claims.)

The terminal pins 34 are formed from an electrically-conductive material such as brass alloy 360 with a gold-over-nickel coating. Each terminal pin 34 has a body portion 34a, a tail portion 34b extending from a lower end of the body portion 34a, and a head portion 34c adjoining an upper end of the body portion 34a (see FIG. 3). A barb 34d is formed around the body portion 34a proximate its lower end.

Each of the through holes 36 is adapted to receive a respective one of the terminal pins 34. More particularly, the body portion 34a of each terminal pin 34 has a diameter that is slightly smaller than a diameter of the through holes 36. The barbs 34d each have a diameter that is slightly larger than that of the diameter of the through holes 36, and each head portion 34c has a diameter that is substantially larger than that of the through holes 36.

The terminal pins 34 are each press fit into a respective one of the through holes 36 until interference between the head portion 34c and the upper surface 32a of the pin support member 32 prevents further insertion of the terminal pin 34. Each body portion 34a has a length (vertical dimension) approximately equal to a height of the through holes 36. Hence, the tail portions 34b extend away from the lower surface 32b of the pin support member 32 when the terminal pins 34 are fully inserted in the pin support member 32. In addition, the head portion 34c of each terminal pin 34 is located on the upper surface 32a of the pin support member 32 when the terminal pins 34 are fully inserted therein.

The body portion 34a is tapered proximate the barb 34d, thereby facilitating downward insertion of the barb 34d into the through hole 36. The barb 34d, once inserted, inhibits the terminal pin 34 from backing out of the through hole 36, i.e., the barb 34d inhibits upward movement of the terminal pin 34 in relation to the pin support member 32. This arrangement produces a "floating pin" arrangement that at least partially compensates for any non-coplanarity between the terminal pins 34 and the socket receptacle 26.

The through holes 36 each have a diameter of approximately 29.5 mils in the exemplary embodiment. The body portions 34a, barbs 34d, and head portions 34c have respective diameters of approximately 27, 30, and 35 mils. These dimensions are included herein for exemplary purposes only, and can vary substantially between applications.

The terminal pins 34 are preferably pressed into the through holes 36 of the pin support member 32 in two phases. In particular, approximately half of the terminal pins 34 are initially pressed into the through holes 36 to form the pattern depicted in FIG. 8A. The remaining terminal pins 34 are then pressed into the remaining through holes 36 to form the final pattern of terminal pins 34 depicted in FIG. 8B. In other words, a first plurality of terminal pins 34 is initially pressed into alternating through holes 36 in each row of through holes 36 on the pin support member 32. In addition, the first plurality of terminal pins 34 is initially pressed into alternating through holes 36 in each column of through holes 36. A second plurality of terminal pins 34 representing the remaining terminal pins 34 is then pressed into the remaining through holes 36.

Applicant has found that inserting the terminal pins 34 in the above-noted sequence minimizes to the potential for warpage of the pin support member 32. This technique is particularly useful in high-density applications such as the exemplary embodiment, where three-hundred or more pins must be packaged within a support member having a relatively small footprint.

Details relating to the socket receptacle 26 are as follows. The socket receptacle 26 comprises a receptacle support member 40, and a plurality of pin receptacles 42 arranged in a pattern that substantially matches the pattern of the terminal pins 34 (see FIGS. 4 and 5). The socket support member 40 is formed from an electrically-insulative material such as FR4. The receptacle support member 40 has an upper surface 40a and a lower surface 40b. The lower surface 40b is preferably coated with a layer of polyimide film 43 such as KAPTON.

A plurality of through holes 44 are formed in the receptacle support member 40 and extend between the upper and lower surfaces 40a, 40b. Each of the through holes 44 is adapted to receive a respective one of the pin receptacles 42, as explained below.

The pin receptacles 42 each comprise a shell portion 42a and a contact member 42b. Each pin receptacle 42 also comprises a button portion 42c adjoining a lower end of the shell portion 42a, and a head portion 42d adjoining an upper end of the shell portion 42a. Each pin receptacle 42 also includes a barb 42e extending around an outer surface of the shell portion 42a. (The size of the barb 42e is exaggerated in FIG. 5, for clarity.)

The shell portion 42a, button portion 42c, head portion 42d, and barb 42e are formed from an electrically-conductive material such as brass alloy 360 with a tin/lead-over-nickel or a gold-over-nickel coating. The contact member 42b is formed from an electrically-conductive material such as beryllium copper alloy with a tin/lead-over-nickel or a gold-over-nickel coating.

The shell portion 42a defines a cavity 46. The contact member 42b of each pin receptacle 42 is positioned within a respective cavity 46. Each cavity 46 is adapted to receive a tail portion 34b of a respective terminal pin 34. Contact between the tail portion 34b and the contact member 42b during insertion of the tail portion 34b causes the contact member 42b to resiliently deflect. The contact member 42b thereby exerts a restraining force on the tail portion 34. In addition, contact between the tail portion 34b, the shell portion 42a, and the contact member 42b establishes electrical contact between each terminal pin 34 and a respective pin receptacle 42.

Each of the through holes 44 is adapted to receive a respective one of the pin receptacles 42, as noted above. More particularly, the body portion 42a of each pin receptacle 42 has a diameter that is slightly smaller than a diameter of the through holes 44. The barbs 42e each have a diameter that is slightly larger than the diameter of the through holes 44, and each head portion 42d has a diameter that is substantially larger than that of the through holes 44.

Each pin receptacle 42 is press fit into a respective one of the through holes 44 until interference between the head portion 42d and the upper surface 40a of the receptacle support member 40 prevents further insertion of the pin receptacle 42. The pin receptacles 42 are preferably pressed into the through holes 44 in the sequence described above in relation to the pin header 24.

Each body portion 42a has a length that is greater than a height of the through holes 44. Hence, a lower end of each body portion 42a and the corresponding button portion 42c extend away from the lower surface 40b of the receptacle support member 40 when the pin receptacles 42 are fully inserted in the receptacle support member 40. In addition, the head portion 42c of each pin receptacle 42 is located on the upper surface 40a of the receptacle support member 40 when the pin receptacles 42 are fully inserted therein.

Each barb 42e is tapered in a manner that facilitates downward insertion of the barb 42e into the through hole 44. The barb 42e, once inserted, inhibits the pin receptacle 42 from backing out of the through hole 44, i.e., the barb 42e inhibits upward movement of the pin receptacle 42 in relation to the receptacle support member 40. This arrangement produces a "floating socket" arrangement that at least partially compensates for any non-coplanarity between the pin receptacles 42 and the circuit substrate 28.

The circuit substrate 28 comprises a body portion 50 formed from an electrically insulative material such as FR4 (see FIG. 1). The socket receptacle 26 is mounted on the upper surface 28a of the circuit substrate 28 and is electrically coupled to the substrate 28 via the electrical connection points 30. More particularly, electrical connection points 30 are arranged in a pattern that substantially matches the pattern of the pin receptacles 42. The button portion 42c of each pin receptacle 42 is mechanically and electrically coupled to a respective electrical connection point 30 by a suitable conventional soldering technique.

It should be noted that the pin receptacles 42 are adapted to be soldered directly to the electrical connection points 30, unlike the pin receptacles of other devices capable of coupling a BGA connector to a circuit substrate. This feature permits the pin receptacles 42 to be closely spaced, and thereby facilitates the use of the interconnect device 10 with high-density BGA connector systems.

The test instrument 20 generates and sends electrical signals to the circuit board 16 and receives responsive signals therefrom, as noted above. The test instrument 20 is adapted to analyze the responsive signals and, based on the analysis, verify that circuit board 16 and the receptacle portion 18 are functioning properly. The test system 14 can thereby be used to perform pre-shipment checks of the circuit board 16 and the BGA connector 18. (The test system 14, and in particular the test instrument 20, can also be adapted for use in research and development testing relating to the circuit board 16 or the BGA connector system 17.)

The test system 14 can be adapted for use with virtually any type of BGA connector, as noted above. For example, the connector system 17 may be a 300-position MEG-Array® connector system, available from the assignee of the present application. Further details of the connector system 17 and presented below, for exemplary purposes.

Figure 6:
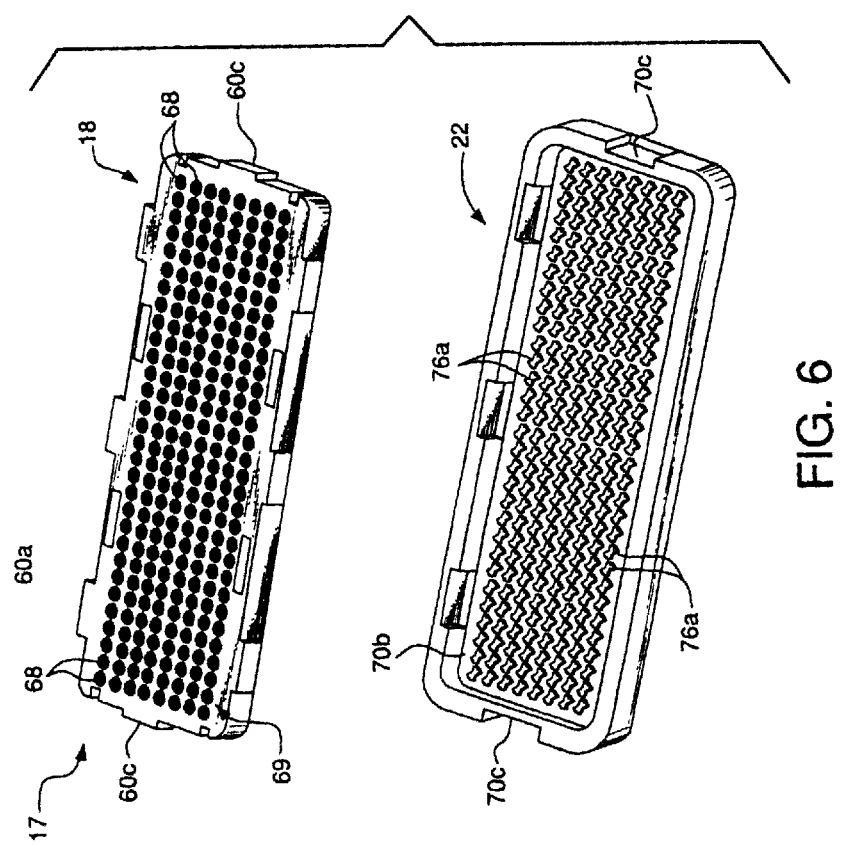
FIG. 6 is a top perspective view of the BGA connector shown in FIG. 1, with a receptacle portion and a plug portion thereof in an unmated state.

The receptacle portion 18 comprises an electrically-insulative receptacle housing 60 having a first surface 60a and a second surface 60b (see FIG. 6). The receptacle housing 60 includes mating features 60c that facilitate mating of the receptacle portion 18 and the plug portion 22.

Figure 7A:
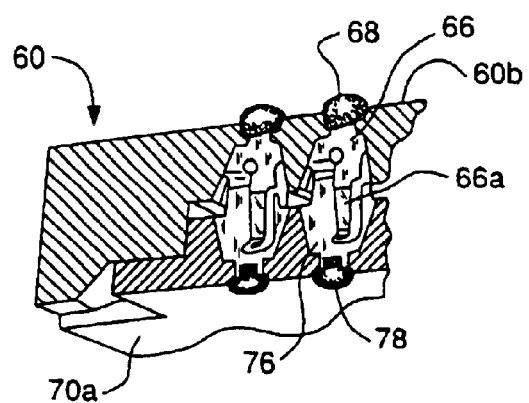
FIG. 7A is a cross-sectional view of the area denoted "A" in FIG. 1, showing the receptacle portion and a plug portion of the BGA connector in a mated state.
Figure 7B:
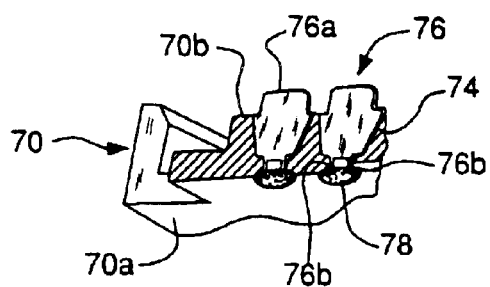
FIG. 7B is a cross-sectional view of the area denoted "A" in FIG. 1, showing the plug portion of the BGA connector only.
Figure 7C:
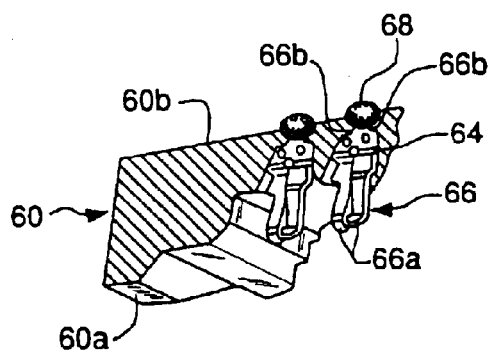
FIG. 7C is a cross-sectional view of the area denoted "A" in FIG. 1, showing the receptacle portion of the BGA connector only.
Figure 8A:
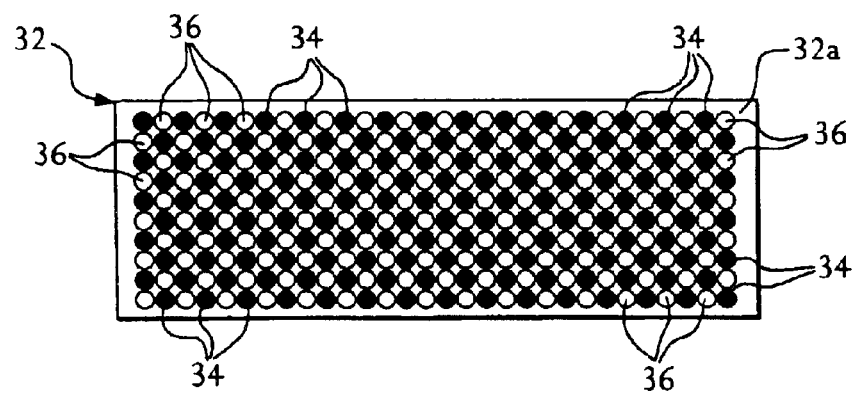
FIG. 8A is a top view of the pin receptacle shown in FIG. 2, in a partially assembled state.
Figure 8B:
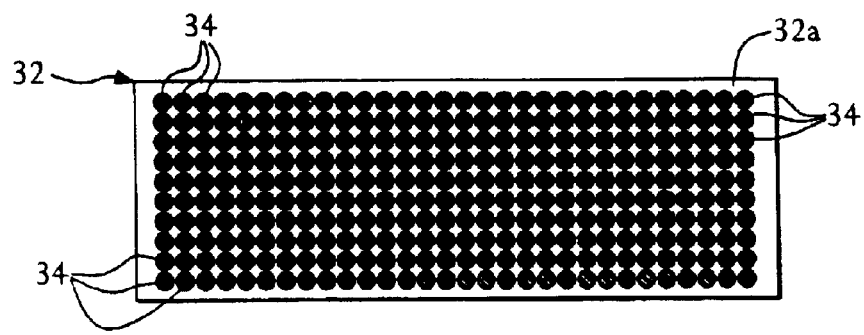
FIG. 8B is a top view of the pin receptacle shown in FIGS. 2 and 8A, in a fully assembled state.

A plurality of through holes 64 are formed in the receptacle housing 60, and extend between the first and second surfaces 60a, 60b (see FIG. 7C). An electrically-conductive female contact member 66 is positioned within each through hole 64. Each female contact member 66 comprise a pair of contact beams 66a, and two tail portions 66b located proximate the second surface 60b. A solder ball 68 is attached to the tail portions 66 of each female contact member 66. Each solder ball 68 forms a hemispherical projection on the second surface 60b.

The solder balls 68 collectively form a ball grid array 69 on the second surface 60a. The receptacle portion 18 is mechanically and electrically coupled to the circuit board 16 by way of the ball grid array 69. In particular, the receptacle portion 18 and the circuit board 16 are joined by aligning each solder ball 68 with a corresponding electrical contact point 16a on the circuit board 16. The solder balls 68 are then reflowed to form a solder joint between each electrical contact point 16a and a respective female contact member 66.

The plug portion 22 comprises an electrically-insulative plug housing 70 having a first surface 70a and a second surface 70b. The plug housing 70 includes mating features 70c that compliment the mating features 60c of the receptacle housing 60.

A plurality of through holes 74 are formed in the plug housing 70, and extend between the first and second surfaces 70a, 70b (see FIG. 7B). An electrically-conductive male contact member 76 is positioned within each through hole 74. Each male contact member 76 has a mating portion 76a that extends away from the second surface 70b, and two tail portions 76b located proximate the first surface 70a. A solder ball 78 is attached to the tail portions 76b of each male contact member 76. Each solder ball 78 forms a hemispherical projection on the first surface 70a.

The solder balls 78 collectively form a ball grid array 79 on the first surface 70a (see FIG. 1). The plug portion 22 is mechanically and electrically coupled to the pin header 24 by way of the ball grid array 79. In particular, the plug portion 22 and the pin header 24 are joined by aligning each solder ball 78 with a corresponding terminal pin 34 on the pin header 24. The solder balls 78 are then reflowed to form a solder joint between each terminal pin 34 and a respective male contact member 76.

The mating features 60c, 70c facilitate mating of the receptacle portion 18 and the plug portion 22, as noted above. In particular, the receptacle portion 18 and the plug portion 22 are mated by substantially aligning the mating features 60c on the receptacle portion 18 with the mating features 70c on the plug portion 22. The mating features 60c, 70c guide the male contact members 76 into contact with the female contact members 66 as the plug portion 22 and the receptacle portion 18 are urged together by the application of force to one or both of the plug portion 22 and the receptacle portion 18.

Continued insertion of the plug portion 22 into the receptacle portion 18 causes the contact beams 66a of each female contact member 66 resiliently engage the mating portion 76a of the corresponding male contact member 76 (see FIG. 7A). More particularly, the contact beams 66a of each female contact member 66 are adapted to deflect outwardly, in opposing directions, in response to the insertion of the mating portion 76a. The mating portion of each male connector 76 is thus clamped between the contact beams 66a of a corresponding female contact member 66 when the receptacle portion 18 and the plug portion 22 are fully mated, thereby establishing electrical contact between the circuit board 16 and the pin header 24.

The plug portion 22 must be reworked or replaced after approximately thirty to fifty mating cycles due to normal wear of the male connectors 76. (The receptacle portion 18 must also be replaced after approximately thirty to fifty mating cycle. The receptacle portion 18, however, typically remains with the test system 14 for no more than one mating cycle; replacement of the receptacle portion 18 it therefore not relevant to this discussion.)

The interconnect device 10 permits replacement of the plug portion 22 without the need to rework or replace the circuit substrate 28. In particular, the plug portion 22 and the pin header 24 can be quickly and easily removed from the test system 10 by manually pulling the pin header 24 from the socket receptacle 26. The worn plug portion 22 can then be discarded along with the attached pin header 24, and a new plug portion 22 and pin header 24 can be installed immediately thereafter. Hence, substantial cost savings can be achieved by eliminating the need to replace or rework the circuit substrate 28 each time the plug portion 22 reaches the end of its useful life. In addition, the efficiency of the pre-shipment testing process for the circuit boards 16 can be increased by eliminating potentially lengthy interruptions in the testing process caused by the need to remove or rework the substrate 28.

It is to be understood that even though numerous characteristics and advantages of the present invention have been set forth in the foregoing description, together with details of the structure and function of the invention, the disclosure is illustrative only, and changes may be made in detail, especially in matters of shape, size, and arrangement of the parts, within the principles of the invention.

For example, the positions of the receptacle portion 18 and the plug portion 22 may be reversed in alternative embodiments, i.e., the plug portion 22 may be fixed to the circuit board 16, and the receptacle portion 18 may be fixed to the pin header 24. In addition, the pin header 24, the plug portion 22, and the receptacle portion 18 can be used as a stand-alone assembly that permits the BGA connector system 70 to be used in a non-surface-mount installation. In other words, the tail portions 34a of each terminal pin 34 can be mounted in through holes on a circuit substrate adapted for subsurface mounting of a connector, thereby coupling the plug portion 22 or the receptacle portion 18 to the substrate.

What is claimed is:

1. A method of maintaining an interconnect device for electrically coupling a test instrument to a circuit board having a first portion of a ball grid array connector mounted thereon, the method comprising:

separating one of a pin header and a socket receptacle of the interconnect device having a second portion of the ball grid array connector mounted thereon from the other of the pin header and the socket receptacle after the second portion of the ball-grid array connector has undergone a predetermined number of mating cycles with a plurality of the first portions of the ball-grid array connector; and subsequently mating another of the one of a pin header and a socket receptacle of the interconnect device having a second portion of the ball grid array connector mounted thereon with the other of the pin header and the socket receptacle.

2. A method of maintaining an interconnect device for electrically coupling a test instrument to a circuit board having a first portion of a ball grid array connector mounted thereon, the method comprising:

separating one of a pin header and a socket receptacle of the interconnect device having a second portion of the ball grid array connector mounted thereon from the other of the pin header and the socket receptacle in response to a predetermined wear criterion for the second portion of the ball-grid array connector; and subsequently mating another of the one of a pin header and a socket receptacle of the interconnect device having a second portion of the ball grid array connector mounted thereon with the other of the pin header and the socket receptacle.

* * * * *